United States Patent
Ito et al.

(10) Patent No.: US 9,136,031 B2
(45) Date of Patent: Sep. 15, 2015

(54) ALUMINA SINTERED BODY, MEMBER INCLUDING THE SAME, AND SEMICONDUCTOR MANUFACTURING APPARATUS

(71) Applicant: NGK SPARK PLUG CO., LTD., Nagoya (JP)

(72) Inventors: Yoichi Ito, Ichinomiya (JP); Masaki Tsuji, Gifu (JP); Akifumi Tosa, Komaki (JP); Takenori Sawamura, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 172 days.

(21) Appl. No.: 13/868,545

(22) Filed: Apr. 23, 2013

(65) Prior Publication Data

US 2013/0285336 A1 Oct. 31, 2013

(30) Foreign Application Priority Data

Apr. 26, 2012 (JP) ................................. 2012-100598
Dec. 20, 2012 (JP) ................................. 2012-277705

(51) Int. Cl.
*H01B 1/08* (2006.01)
*C04B 35/111* (2006.01)
(Continued)

(52) U.S. Cl.
CPC .............. *H01B 1/08* (2013.01); *C04B 35/111* (2013.01); *C04B 35/6455* (2013.01); *H01L 21/67069* (2013.01); *H01L 21/6833* (2013.01); *C04B 2235/85* (2013.01); *Y10T 279/23* (2015.01)

(58) Field of Classification Search
CPC .............. C04B 2235/3224; C04B 2235/3217; C04B 2235/3205; C04B 2235/96; C04B 35/10; C04B 35/101; C04B 35/1015; C04B 35/111; C04B 35/117; C04B 35/46; C04B 35/50; C04B 35/6455; C04B 2235/85; H01L 21/6833; H01L 21/683; H01L 21/67069; H02N 13/00; F23Q 3/002; F23Q 3/004; F23Q 3/006; H01B 1/14; H01B 1/08; H01B 3/12; Y10T 279/23
USPC .................................. 501/152, 153, 134, 135
See application file for complete search history.

(56) References Cited

U.S. PATENT DOCUMENTS 3,905,845 A * 9/1975 Kobayashi et al. ........... 501/119
7,248,457 B2 7/2007 Miyaji et al.
(Continued)

FOREIGN PATENT DOCUMENTS

JP 2004-292267 A 10/2004
JP 2005-104746 A 4/2005
(Continued)

*Primary Examiner* — Mark Kopec
*Assistant Examiner* — Matthew R Diaz
(74) *Attorney, Agent, or Firm* — Leason Ellis LLP

(57) ABSTRACT

An alumina sintered body contains alumina as a main component and titanium. The alumina sintered body further contains at least one element selected from the group consisting of lanthanum, neodymium, and cerium. Aluminum is contained in the alumina sintered body in an amount such that a ratio of aluminum oxide to total oxides in the alumina sintered body becomes 93.00 to 99.85% by weight where the total oxides are defined as a total amount of all oxides contained in the alumina sintered body. Titanium is contained in an amount such that a ratio of titanium oxide to the total oxides becomes 0.10 to 2.00% by weight. Lanthanum, neodymium, and cerium are contained in a combined amount such that a ratio of the combined amount to the total oxides becomes 0.05 to 5.00% by weight. Volume resistivity is $1\times10^5$ to $1\times10^{12}$ $\Omega$·cm at room temperature.

15 Claims, 6 Drawing Sheets

(51) Int. Cl.
*C04B 35/645* (2006.01)
*H01L 21/67* (2006.01)
*H01L 21/683* (2006.01)

(56) References Cited

U.S. PATENT DOCUMENTS

| | | | |
|---|---|---|---|
| 7,450,365 | B2 | 11/2008 | Miyaji et al. |
| 7,907,383 | B2* | 3/2011 | Ando et al. ............... 361/234 |
| 8,236,722 | B2* | 8/2012 | Teratani et al. ............ 501/153 |
| 2007/0109713 | A1 | 5/2007 | Miyaji et al. |
| 2007/0258187 | A1 | 11/2007 | Miyaji et al. |
| 2009/0273877 | A1 | 11/2009 | Ando et al. |
| 2010/0148653 | A1* | 6/2010 | Kuribayashi et al. ........ 313/118 |
| 2011/0251042 | A1 | 10/2011 | Araki et al. |

FOREIGN PATENT DOCUMENTS

| | | |
|---|---|---|
| JP | 2007-214287 A | 8/2007 |
| JP | 4623159 B2 | 11/2010 |
| JP | 2011-219301 A | 11/2011 |

* cited by examiner

FIG. 3

| SAMPLE NUMBERS | CONTAINED AMOUNT OF ELEMENT (IN TERMS OF OXIDE, wt%) | | | | | VOLUME RESISTIVITY ($\Omega \cdot cm$) | MOLAR RATIO (La+Nd+Ce)/Ti | BULK DENSITY (g/cm$^3$) | WATER CONTENT (%) | IRREGULARITY OF COLOR TONE |
|---|---|---|---|---|---|---|---|---|---|---|
| | Al | Ti | La,Nd,Ce | | Si | Mg | | | | |
| 1 | 99.81 | 0.12 | La | 0.07 | 0.00 | 0.00 | $8 \times 10^{11}$ | 0.29 | 3.91 | <0.1 | NONE |
| 2 | 99.13 | 0.80 | La | 0.07 | 0.00 | 0.00 | $6 \times 10^{9}$ | 0.04 | 3.91 | <0.1 | NONE |
| 3 | 99.04 | 0.85 | La | 0.11 | 0.00 | 0.00 | $8 \times 10^{8}$ | 0.06 | 3.89 | <0.1 | NONE |
| 4 | 98.13 | 1.80 | La | 0.07 | 0.00 | 0.00 | $2 \times 10^{7}$ | 0.02 | 3.85 | 0.6 | NONE |
| 5 | 97.37 | 1.25 | La | 1.38 | 0.00 | 0.00 | $5 \times 10^{8}$ | 0.54 | 3.96 | <0.1 | NONE |
| 6 | 95.36 | 0.36 | La | 4.28 | 0.00 | 0.00 | $9 \times 10^{10}$ | 5.83 | 3.93 | <0.1 | PRESENT |
| 7 | 95.35 | 0.45 | La | 4.20 | 0.00 | 0.00 | $8 \times 10^{10}$ | 4.58 | 3.94 | <0.1 | NONE |
| 8 | 94.90 | 0.30 | La | 4.80 | 0.00 | 0.00 | $1 \times 10^{11}$ | 7.85 | 3.94 | <0.1 | PRESENT |
| 9 | 94.00 | 1.20 | La | 4.80 | 0.00 | 0.00 | $9 \times 10^{7}$ | 1.96 | 3.94 | <0.1 | NONE |
| 10 | 93.40 | 1.80 | La | 4.80 | 0.00 | 0.00 | $4 \times 10^{6}$ | 1.31 | 3.94 | <0.1 | NONE |
| 11 | 99.42 | 0.31 | La | 0.07 | 0.20 | 0.00 | $7 \times 10^{9}$ | 0.11 | 3.91 | <0.1 | NONE |
| 12 | 99.31 | 0.41 | La | 0.19 | 0.10 | 0.00 | $2 \times 10^{9}$ | 0.23 | 3.92 | <0.1 | NONE |
| 13 | 99.08 | 0.54 | La | 0.25 | 0.13 | 0.00 | $2 \times 10^{7}$ | 0.23 | 3.93 | <0.1 | NONE |
| 14 | 98.93 | 0.80 | La | 0.07 | 0.20 | 0.00 | $9 \times 10^{7}$ | 0.04 | 3.91 | <0.1 | NONE |
| 15 | 98.92 | 0.31 | La | 0.07 | 0.70 | 0.00 | $1 \times 10^{9}$ | 0.11 | 3.91 | <0.1 | NONE |
| 16 | 98.85 | 0.68 | La | 0.31 | 0.17 | 0.00 | $3 \times 10^{6}$ | 0.22 | 3.93 | <0.1 | NONE |
| 17 | 98.48 | 0.80 | La | 0.44 | 0.27 | 0.00 | $3 \times 10^{6}$ | 0.27 | 3.93 | <0.1 | NONE |
| 18 | 98.43 | 0.80 | La | 0.07 | 0.70 | 0.00 | $2 \times 10^{6}$ | 0.04 | 3.92 | <0.1 | NONE |
| 19 | 97.81 | 1.11 | La | 0.67 | 0.41 | 0.00 | $2 \times 10^{6}$ | 0.30 | 3.91 | <0.1 | NONE |
| 20 | 93.25 | 1.80 | La | 4.02 | 0.93 | 0.00 | $4 \times 10^{6}$ | 1.10 | 3.94 | <0.1 | NONE |
| 21 | 94.59 | 0.41 | La | 4.80 | 0.00 | 0.20 | $3 \times 10^{11}$ | 5.74 | 3.94 | <0.1 | PRESENT |
| 22 | 94.09 | 0.41 | La | 4.80 | 0.00 | 0.70 | $8 \times 10^{11}$ | 5.74 | 3.94 | <0.1 | PRESENT |
| 23 | 93.80 | 1.20 | La | 4.80 | 0.00 | 0.20 | $2 \times 10^{10}$ | 1.96 | 3.94 | <0.1 | NONE |
| 24 | 93.30 | 1.20 | La | 4.80 | 0.00 | 0.70 | $2 \times 10^{11}$ | 1.96 | 3.95 | <0.1 | NONE |
| 25 | 99.21 | 0.41 | La | 0.19 | 0.10 | 0.10 | $8 \times 10^{9}$ | 0.23 | 3.92 | <0.1 | NONE |
| 26 | 98.80 | 0.68 | La | 0.31 | 0.17 | 0.05 | $2 \times 10^{7}$ | 0.22 | 3.93 | <0.1 | NONE |
| 27 | 98.50 | 0.81 | La | 0.37 | 0.20 | 0.13 | $2 \times 10^{8}$ | 0.22 | 3.94 | <0.1 | NONE |
| 28 | 97.45 | 1.08 | La | 1.32 | 0.09 | 0.06 | $1 \times 10^{9}$ | 0.60 | 3.95 | <0.1 | NONE |
| 29 | 97.42 | 1.22 | La | 0.67 | 0.41 | 0.28 | $3 \times 10^{6}$ | 0.27 | 3.94 | <0.1 | NONE |
| 30 | 97.12 | 1.08 | La | 1.32 | 0.42 | 0.06 | $7 \times 10^{8}$ | 0.60 | 3.95 | <0.1 | NONE |
| 31 | 97.10 | 0.78 | Ce | 1.43 | 0.42 | 0.28 | $7 \times 10^{9}$ | 0.85 | 3.94 | <0.1 | NONE |
| 32 | 97.08 | 0.79 | Nd | 1.42 | 0.42 | 0.28 | $6 \times 10^{9}$ | 0.85 | 3.93 | <0.1 | NONE |
| 33 | 94.53 | 1.50 | La | 2.62 | 0.81 | 0.54 | $3 \times 10^{8}$ | 0.86 | 3.94 | <0.1 | NONE |
| 34 | 93.56 | 1.15 | La | 4.67 | 0.37 | 0.25 | $3 \times 10^{9}$ | 1.99 | 3.95 | <0.1 | NONE |
| 35 | 99.80 | 0.20 | — | 0.00 | 0.00 | 0.00 | $8 \times 10^{15}$ | 0.00 | 3.81 | 5.6 | NONE |
| 36 | 98.20 | 1.80 | — | 0.00 | 0.00 | 0.00 | $7 \times 10^{12}$ | 0.00 | 3.84 | 1.1 | NONE |
| 37 | 99.92 | 0.05 | La | 0.03 | 0.00 | 0.00 | $6 \times 10^{14}$ | 0.29 | 3.82 | 4.7 | NONE |
| 38 | 98.12 | 1.85 | La | 0.03 | 0.00 | 0.00 | $6 \times 10^{12}$ | 0.01 | 3.83 | 2.7 | NONE |
| 39 | 97.64 | 0.05 | La | 2.31 | 0.00 | 0.00 | $3 \times 10^{14}$ | 22.66 | 3.91 | <0.1 | PRESENT |
| 40 | 93.00 | 2.20 | La | 4.80 | 0.00 | 0.00 | $7 \times 10^{4}$ | 1.07 | 3.94 | <0.1 | NONE |

FIG. 4

| SAMPLE NUMBERS | CONTAINED AMOUNT OF ELEMENT (IN TERMS OF OXIDE, wt%) | | | | | | | | VOLUME RESISTIVITY ($\Omega \cdot cm$) | MOLAR RATIO (La+Nd+Ce)/Ti | BULK DENSITY ($g/cm^3$) | WATER CONTENT (%) | IRREGULARITY OF COLOR TONE |
|---|---|---|---|---|---|---|---|---|---|---|---|---|---|
| | Al | Ti | La,Nd,Ce | | Si | Mg | Ca | Ba | Sr | | | | | |
| 41 | 99.21 | 0.54 | La | 0.25 | 0.00 | 0.00 | 0.00 | 0.00 | 0.00 | $2.0 \times 10^8$ | 0.22 | 3.93 | <0.1 | NONE |
| 42 | 99.31 | 0.50 | La | 0.14 | 0.00 | 0.05 | 0.00 | 0.00 | 0.00 | $9.6 \times 10^8$ | 0.13 | 3.91 | <0.1 | NONE |
| 43 | 99.16 | 0.43 | La | 0.26 | 0.00 | 0.14 | 0.00 | 0.00 | 0.00 | $9.0 \times 10^{10}$ | 0.30 | 3.92 | <0.1 | NONE |
| 44 | 98.98 | 0.48 | La | 0.25 | 0.00 | 0.29 | 0.00 | 0.00 | 0.00 | $8.9 \times 10^{11}$ | 0.25 | 3.93 | <0.1 | NONE |
| 45 | 98.97 | 0.75 | La | 0.20 | 0.00 | 0.07 | 0.00 | 0.00 | 0.00 | $6.9 \times 10^7$ | 0.13 | 3.96 | <0.1 | NONE |
| 46 | 98.91 | 0.68 | La | 0.31 | 0.00 | 0.11 | 0.00 | 0.00 | 0.00 | $2.7 \times 10^8$ | 0.22 | 3.95 | <0.1 | NONE |
| 47 | 98.89 | 0.62 | La | 0.25 | 0.00 | 0.24 | 0.00 | 0.00 | 0.00 | $2.3 \times 10^{11}$ | 0.20 | 3.91 | <0.1 | NONE |
| 48 | 98.90 | 0.94 | La | 0.11 | 0.00 | 0.05 | 0.00 | 0.00 | 0.00 | $1.3 \times 10^8$ | 0.06 | 3.93 | <0.1 | NONE |
| 49 | 98.86 | 0.65 | La | 0.30 | 0.00 | 0.18 | 0.00 | 0.00 | 0.00 | $1.3 \times 10^9$ | 0.23 | 3.91 | <0.1 | NONE |
| 50 | 98.86 | 0.87 | La | 0.22 | 0.00 | 0.05 | 0.00 | 0.00 | 0.00 | $7.5 \times 10^8$ | 0.13 | 3.94 | <0.1 | NONE |
| 51 | 98.80 | 0.52 | La | 0.48 | 0.00 | 0.20 | 0.00 | 0.00 | 0.00 | $6.4 \times 10^9$ | 0.45 | 3.02 | <0.1 | NONE |
| 52 | 98.75 | 0.67 | La | 0.53 | 0.00 | 0.05 | 0.00 | 0.00 | 0.00 | $1.3 \times 10^9$ | 0.39 | 3.94 | <0.1 | NONE |
| 53 | 98.83 | 0.84 | La | 0.23 | 0.00 | 0.04 | 0.06 | 0.00 | 0.00 | $8.4 \times 10^8$ | 0.13 | 3.94 | <0.1 | NONE |
| 54 | 98.88 | 0.79 | La | 0.22 | 0.00 | 0.00 | 0.11 | 0.00 | 0.00 | $1.5 \times 10^9$ | 0.13 | 3.94 | <0.1 | NONE |
| 55 | 98.89 | 0.62 | La | 0.25 | 0.00 | 0.00 | 0.24 | 0.00 | 0.00 | $7.8 \times 10^{11}$ | 0.20 | 3.91 | <0.1 | NONE |
| 56 | 98.81 | 0.79 | La | 0.21 | 0.00 | 0.04 | 0.00 | 0.15 | 0.00 | $3.5 \times 10^7$ | 0.13 | 3.94 | <0.1 | NONE |
| 57 | 98.77 | 0.74 | La | 0.20 | 0.00 | 0.00 | 0.00 | 0.28 | 0.00 | $1.5 \times 10^6$ | 0.13 | 3.93 | <0.1 | NONE |
| 58 | 98.90 | 0.94 | La | 0.11 | 0.00 | 0.00 | 0.00 | 0.05 | 0.00 | $1.3 \times 10^6$ | 0.06 | 3.93 | <0.1 | NONE |
| 59 | 98.59 | 0.68 | Nd | 0.63 | 0.00 | 0.11 | 0.00 | 0.00 | 0.00 | $1.4 \times 10^9$ | 0.44 | 3.94 | <0.1 | NONE |
| 60 | 99.85 | 0.75 | La | 0.16 | 0.00 | 0.00 | 0.00 | 0.00 | 0.24 | $4.6 \times 10^6$ | 0.21 | 3.93 | <0.1 | NONE |

ALUMINA SINTERED BODY, MEMBER INCLUDING THE SAME, AND SEMICONDUCTOR MANUFACTURING APPARATUS

CROSS-REFERENCE TO RELATED PATENT APPLICATIONS

This application claims the benefit of Japanese Patent Applications No. 2012-100598, filed Apr. 26, 2012, and No. 2012-277705, filed Dec. 20, 2012, all of which are incorporated by reference herein.

FIELD OF THE INVENTION

The present invention relates to an alumina sintered body, a member including the same, and a semiconductor manufacturing apparatus.

BACKGROUND OF THE INVENTION

In the related art, an alumina sintered body, which is obtained by mixing a conductivity applying agent such as a titanium oxide ($TiO_2$) with alumina ($Al_2O_3$) that is an insulating substance, has been known. When mixing the conductivity applying agent with alumina, volume resistivity of the alumina sintered body may be adjusted. For example, a configuration in which the volume resistivity of the alumina sintered body is adjusted to $10^5$ to $10^{10}$ Ω·cm, and this alumina sintered body is used as a member that needs to have a static electricity removal function and is used for a semiconductor manufacturing apparatus and the like is suggested (for example, refer to JP-A-2004-292267). In addition, a configuration in which the volume resistivity of the alumina sintered body is adjusted to $10^8$ to $10^{11}$ Ω·cm and this alumina sintered body is used as an electrostatic chuck (Johnson-Rahbeck type electrostatic chuck) that is used to fix a silicon wafer in a plasma chamber for manufacturing of a semiconductor is suggested (for example, refer to Japanese Patent No. 04623159).

However, as described above, in a case where the alumina sintered body is used for the plasma chamber, since the alumina sintered body is exposed to plasma, the silicon wafer may be contaminated by a titanium oxide that is added to alumina. A countermeasure of limiting an additive amount of the titanium oxide may be considered to suppress the contamination. However, since the volume resistivity of the alumina sintered body is adjusted by an additive amount of the titanium oxide, when the additive amount of the titanium oxide is limited, an alumina sintered body, which exhibits desired volume resistivity, may not be obtained. In addition, a method in which for example, a specific treatment such as hot pressing and HIP (hot isostatic pressing) treatment is performed during the manufacturing of the alumina sintered body to obtain the alumina sintered body having a desired performance is also suggested (for example, refer to Japanese Patent No. 04623159). It is preferable to manufacture the alumina sintered body by a relatively simple manufacturing method.

The invention has been made to solve the above described problems in the related art, and an object thereof is to provide an alumina sintered body that exhibits desired volume resistivity while suppressing complications of a manufacturing process and an amount of a titanium oxide that is added to alumina, a member including the alumina sintered body, and an apparatus including the member.

SUMMARY OF THE INVENTION

The invention has been made to solve at least a part of the above-described problems, and may be executed as the following embodiments or application examples.

APPLICATION EXAMPLE 1

According to Application Example 1, there is provided an alumina sintered body containing: alumina ($Al_2O_3$) as a main component; and titanium (Ti). The alumina sintered body further contains at least one element selected from the group consisting of lanthanum (La), neodymium (Nd), and cerium (Ce), aluminum (Al) and is contained in an amount such that a ratio of aluminum oxide ($Al_2O_3$) to total oxides in the alumina sintered body becomes 93.00 to 99.85% by weight, wherein said total oxides are defined as a total amount of all oxides contained in the alumina sintered body and an amount of each metal in the alumina sintered body being converted into an amount of an oxide containing the metal, titanium (Ti) is contained in an amount such that a ratio of titanium oxide ($TiO_2$) to the total oxides becomes 0.10 to 2.00% by weight, lanthanum (La), neodymium (Nd), and cerium (Ce) are contained in a combined amount such that a ratio of a combined amount of lanthanum oxide ($La_2O_3$), neodymium oxide ($Nd_2O_3$), and cerium oxide ($CeO_2$) to the total oxides becomes 0.05 to 5.00% by weight, and volume resistivity of the alumina sintered body is $1\times10^5$ to $1\times10^{12}$ Ω·cm at room temperature.

According to the alumina sintered body according to Application Example 1, since the alumina sintered body contains at least one kind of element selected from lanthanum, neodymium, and cerium, even when an additive amount of titanium is limited, the volume resistivity may be controlled within a wide range of $1\times10^5$ to $1\times10^{12}$ Ω·cm. In addition, even when the additive amount of titanium is limited within the above-described range, the volume resistivity of the alumina sintered body may be controlled in a relatively wide range compared to a case in which any element of lanthanum, neodymium, and cerium is not added. Furthermore, according to the alumina sintered body according to Application Example 1, even when firing is performed at a normal pressure without performing firing under pressure such as hot pressing and HIP (hot isostatic pressing) treatment, a relatively dense sintered body may be obtained. Accordingly, in a case of performing the firing at a normal pressure, it is not necessary to control pressure during the firing, and thus complication of an apparatus that is used for the firing may be suppressed.

APPLICATION EXAMPLE 2

In the alumina sintered body according to Application Example 1, a molar ratio of the combined amount of lanthanum (La), neodymium (Nd), and cerium (Ce) to titanium (Ti), which are contained in the alumina sintered body, may be larger than 0.03 and be less than 5.00.

According to the alumina sintered body according to Application Example 2, when the molar ratio is set to be larger than 0.03, in a firing process during the manufacturing of the alumina sintered body, a titanium-containing compound having a melting point lower than a firing temperature is formed, and sintering is promoted due to the low melting point compound, and thus densification of the alumina sintered body may be secured. In addition, when the molar ratio is set to be less than 5.00, an irregularity of a color tone in external appearance of the alumina sintered body may be suppressed.

APPLICATION EXAMPLE 3

The alumina sintered body according to Application Example 1 or 2 may further contain at least one of silicon (Si) and magnesium (Mg) Silicon (Si) and magnesium (Mg) may be contained in an amount such that a ratio of silicon oxide ($SiO_2$) to the total oxides and a ratio of magnesium oxide (MgO) to the total oxides are 1.00% by weight or less, respectively.

According to the alumina sintered body according to Application Example 3, when the alumina sintered body contains at least one of silicon and magnesium, and contained ratios thereof when converting metal elements contained in the alumina sintered body into oxides are set to 1.0% by weight or less, respectively, the volume resistivity at room temperature of the alumina sintered body may be further easily adjusted within a range of $1\times10^5$ to $1\times10^{12}$ $\Omega\cdot cm$. In addition, since the additive amount of silicon and magnesium is suppressed within the above-described range, when the alumina sintered body is used as a constituent member of a semiconductor manufacturing apparatus, contamination of a semiconductor wafer, which is caused by the addition of silicon or magnesium, may be suppressed.

APPLICATION EXAMPLE 4

According to Application Example 4, there is provided an alumina sintered body containing: alumina ($Al_2O_3$) as a main component; and titanium (Ti). Metal elements other than aluminum (Al) and titanium (Ti) contained in the alumina sintered body include: at least one element selected from the group consisting of lanthanum (La), neodymium (Nd), and cerium (Ce); and at least one element selected from the group consisting of magnesium (Mg), calcium (Ca), strontium (Sr), barium (Ba), and silicon (Si). Aluminum (Al) is contained in an amount such that a ratio of aluminum oxide ($Al_2O_3$) to total oxides in the alumina sintered body becomes 93.00 to 99.85% by weight, wherein said total oxides are defined as a total amount of all oxides contained in the alumina sintered body and an amount of each metal in the alumina sintered body being converted into an amount of an oxide containing the metal. Titanium (Ti) is contained in an amount such that a ratio of titanium oxide ($TiO_2$) to the total oxides becomes 0.10 to 2.00% by weight. Lanthanum (La), neodymium (Nd), and cerium (Ce) are contained in a combined amount such that a ratio of a combined amount of lanthanum oxide ($La_2O_3$), neodymium oxide ($Nd_2O_3$), and cerium oxide ($CeO_2$) to the total oxides becomes 0.05 to 5.00% by weight. Magnesium (Mg), calcium (Ca), strontium (Sr), barium (Ba), and silicon (Si) are contained in amounts such that the ratio of magnesium oxide (MgO) to the total oxides, the ratio of calcium oxide (CaO) to the total oxides, the ratio of strontium oxide (SrO) to the total oxides, the ratio of barium oxide (BaO) to the total oxides, and the ratio of silicon oxide ($SiO_2$) to the total oxides are all 1.00% by weight or less, respectively. Volume resistivity of the alumina sintered body is $1\times10^5$ to $1\times10^{12}$ $\Omega\cdot cm$ at room temperature.

According to the alumina sintered body according to Application Example 4, since the alumina sintered body contains at least one kind of element selected from lanthanum, neodymium, and cerium, even when the additive amount of titanium is limited, the volume resistivity may be controlled within a wide range of $1\times10^5$ to $1\times10^{12}$ $\Omega\cdot cm$. In addition, even when firing is performed at a normal pressure without performing firing under pressure such as hot pressing and HIP (hot isostatic pressing) treatment, a relatively dense sintered body may be obtained. Accordingly, in a case of performing the firing at atmospheric pressure, it is not necessary to control pressure during the firing, and thus complication of an apparatus that is used for the firing may be suppressed. Furthermore, when the alumina sintered body contains at least one kind of element selected from magnesium, calcium, strontium, barium, and silicon, and contained ratios thereof when converting metal elements contained in the alumina sintered body into oxides are set to 1.0% by weight or less, respectively, the volume resistivity at room temperature of the alumina sintered body may be further easily adjusted within a range of $1\times10^5$ to $1\times10^{12}$ $\Omega\cdot cm$. In addition, in a case where the additive amount of at least one kind of element selected from magnesium, calcium, strontium, barium, and silicon is suppressed within the above-described range, when the alumina sintered body is used as a constituent member of a semiconductor manufacturing apparatus, contamination of a semiconductor wafer, which is caused by the addition of the above-described elements, may be suppressed.

APPLICATION EXAMPLE 5

According to Application Example 5, there is provided an electrostatic chuck including the alumina sintered body having volume resistivity of $1\times10^8$ to $1\times10^{12}$ $\Omega\cdot cm$ at room temperature according to anyone of Application Examples 1 to 4.

According to the electrostatic chuck according to Application Example 5, suction and release properties of the electrostatic chuck during suction and release of a semiconductor wafer may be secured, and a possibility of contamination in the semiconductor wafer, which is caused by the metal elements in the alumina sintered body provided to the electrostatic chuck, may be suppressed.

APPLICATION EXAMPLE 6

According to Application Example 6, there is provided a member having a static electricity removal function for a semiconductor manufacturing apparatus. The member includes the alumina sintered body having volume resistivity of $1\times10^5$ to $1\times10^{10}$ $\Omega\cdot cm$ at room temperature according to any one of Application Examples 1 to 4.

According to the member having the static electricity removal function for semiconductor manufacturing apparatus according to Application Example 6, in the member that is used in the semiconductor manufacturing apparatus, the static electricity removal function is secured, and a possibility of contamination in the semiconductor wafer, which is caused by the metal elements in the alumina sintered body provided to the member, may be suppressed.

APPLICATION EXAMPLE 7

According to Application Example 7, there is provided a semiconductor manufacturing apparatus including a plasma chamber. The electrostatic chuck according to Application Example 5 or the member having the static electricity removal function according to Application Example 6 is provided within the plasma chamber.

According to the semiconductor manufacturing apparatus according to Application Example 7, with regard to the electrostatic chuck or the member having the static electricity removal function that is disposed in the plasma chamber of the semiconductor manufacturing apparatus, appropriate volume resistivity may be secured. In addition, a possibility of contamination in the semiconductor wafer, which is caused by the metal elements in the electrostatic chuck or the member having the static electricity removal function that is disposed in the plasma chamber, may be suppressed.

The invention may be realized by various embodiments other than the above-described Application Examples, and for example, the invention may be realized by an embodiment such as a method of manufacturing an alumina sintered body.

BRIEF DESCRIPTION OF THE DRAWINGS

These and other features and advantages of the present invention will become more readily appreciated when considered in connection with the following detailed description and appended drawings, wherein like designations denote like elements in the various views, and wherein:

FIG. 3 is an explanatory diagram illustrating preparation results of an alumina sintered body as a table;

FIG. 4 is an explanatory diagram illustrating preparation results of the alumina sintered body as a table;

DETAILED DESCRIPTION OF THE INVENTION

Figure 1:
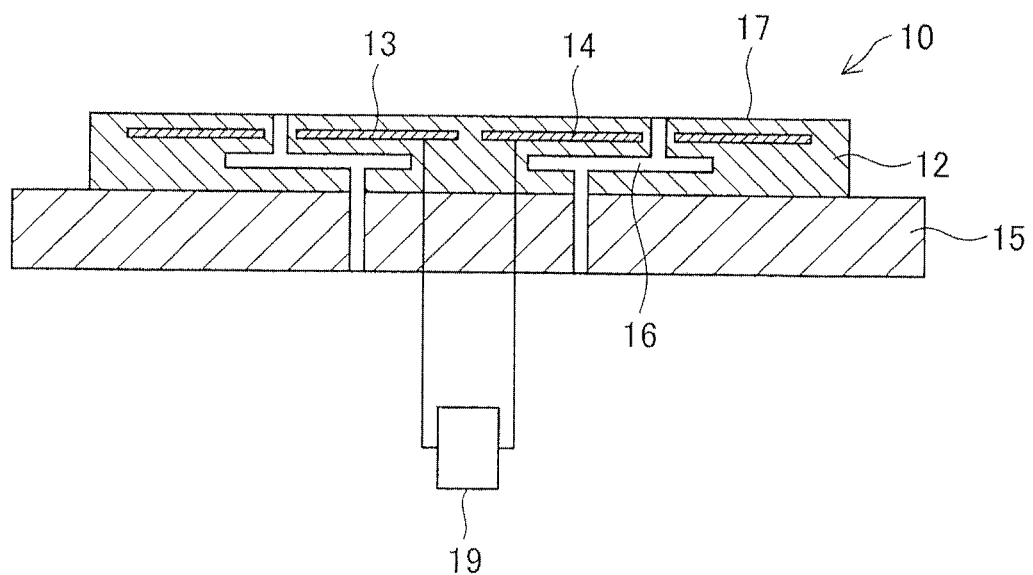
FIG. 1 is a schematic cross-sectional diagram illustrating an example of a configuration of an electrostatic chuck.

Composition and Manufacturing Method of Alumina Sintered Body

An alumina sintered body of this embodiment contains alumina ($Al_2O_3$) as a main component, and titanium (Ti). The alumina sintered body further contains at least one kind of element selected from lanthanum (La), neodymium (Nd), and cerium (Ce). In addition, in the alumina sintered body of this embodiment, aluminum (Al) is contained in an amount in which a ratio of aluminum oxide ($Al_2O_3$) to total oxides when converting metal elements contained in the alumina sintered body into oxides and summing the oxides becomes 93.00 to 99.85% by weight. In addition, titanium (Ti) is contained in an amount in which a ratio of titanium oxide ($TiO_2$) to total oxides when converting the metal elements contained in the alumina sintered body into oxides and summing the oxides becomes 0.1 to 2.0% by weight. In addition, lanthanum (La), neodymium (Nd), and cerium (Ce) are contained in a total amount in which a ratio of a total amount of lanthanum oxide ($La_2O_3$), neodymium oxide ($Nd_2O_3$), and cerium oxide ($CeO_2$) to total oxides when converting the metal elements contained in the alumina sintered body into oxides and summing the oxides becomes 0.05 to 5.00% by weight. In addition, the alumina sintered body of this embodiment has volume resistivity of $1\times10^5$ to $1\times10^{12}$ Ω·cm at room temperature.

As described above, in the alumina sintered body of this embodiment, in addition to titanium (Ti), at least one kind of element selected from lanthanum (La), neodymium (Nd), and cerium (Ce) is added to the alumina that is a main component. Accordingly, even when an additive amount of titanium is limited within the above-described range, the volume resistivity at room temperature may be controlled to a desired value within a wide range of $1\times10^5$ to $1\times10^{12}$ Ω·cm. In addition, in a case where the additive amount of titanium is limited within the above-described range, the volume resistivity of the alumina sintered body may be controlled in a relatively wide range compared to a case in which any element of lanthanum, neodymium, and cerium is not added.

Here, there is limitation to an amount of elements, which are added to the alumina sintered body, for each element that is added according to usage of the alumina sintered body. Particularly, in a case of applying the alumina sintered body to a semiconductor manufacturing apparatus, it is necessary for the amount of the metal elements that are added to the alumina sintered body to be further reduced. Among these, in a case of using the alumina sintered body in a plasma chamber, with regard to a degree of a contamination effect on a semiconductor wafer, since a contamination effect due to titanium is large, it is particularly preferable to reduce titanium. According to the alumina sintered body of this embodiment, when adjusting the volume resistivity by the amount of titanium (Ti) that is added to the alumina sintered body, only an element that is selected from lanthanum (La), neodymium (Nd), and cerium (Ce) may be added. According to this, in a case of applying the alumina sintered body to the semiconductor manufacturing apparatus, it is possible to obtain an alumina sintered body that exhibits desired volume resistivity while largely decreasing a level of an additive amount of titanium that is particularly problematic from the viewpoint of contamination of the semiconductor wafer (for example, a silicon wafer). Specifically, the volume resistivity of the alumina sintered body may be set to a value that is appropriate for an electrostatic chuck or a member having a static electricity removal function for the semiconductor manufacturing apparatus. In addition, at this time, an amount of an element, which is selected from lanthanum, neodymium, and cerium and is added to suppress the additive amount of titanium, may be set to a limited amount capable of suppressing an effect of contaminating the semiconductor wafer. Accordingly, when this alumina sintered body is applied to the semiconductor manufacturing apparatus, contamination of the semiconductor wafer may be suppressed.

Furthermore, according to the alumina sintered body of this embodiment, at least one kind of element selected from lanthanum (La), neodymium (Nd), and cerium (Ce) is added in addition to titanium (Ti), and thus a firing process during manufacturing of the alumina sintered body may be performed at a normal pressure. Generally, it is preferable to form the alumina sintered body in a sufficiently dense manner so as to secure the minimum mechanical strength or stability of the volume resistivity of a constituent member for the semiconductor manufacturing apparatus. According to the alumina sintered body of this embodiment, the above-described configuration is adapted, and thus even when the firing is performed at a normal pressure, a relatively dense sintered body may be obtained. In this manner, since the firing at the normal pressure is possible, it is not necessary to control pressure during the firing, and thus complication of an apparatus that is used for the firing may be suppressed.

For example, the alumina sintered body of this embodiment may be formed by a solid-phase reaction method. The solid-phase reaction method is a well known method in which powder raw materials such as an oxide, carbonate, and nitrate are weighed and mixed with each other in such a manner that a metal element in each of the powder raw materials becomes a predetermined ratio according to a composition of an oxide to be prepared, and a heat treatment (firing) is performed to synthesize a desired oxide. Hereinafter, a manufacturing method accompanied with preparation of a ceramic green sheet will be described as an example of a manufacturing method according to the solid-phase reaction method. However, the alumina sintered body of this embodiment may be prepared according to other methods such as a manufacturing method by press molding using powders.

In this embodiment, an aluminum-containing powder raw material (for example, $Al_2O_3$), a titanium-containing powder raw material (for example, $TiO_2$), and a powder raw material (for example, $La(OH)_3$, $Nd_2O_3$, or $CeO_2$) that contains at least one kind selected from lanthanum, neodymium, and cerium may be used. When mixing these powder raw materials, a mixed amount of each of the powder raw materials may be set in such a manner that a ratio (% by weight) of each metal oxide to total oxides is within the above-described numerical range respectively, where the total oxides represent a combined amount of oxides that are converted from the metal elements contained in the powder raw materials. At this time, a specific mixing ratio of the respective powder raw materials maybe set in such a manner that the volume resistivity of the alumina sintered body, which maybe obtained, becomes a desired value within the above-described range. In addition, in the alumina sintered body that is ultimately obtained, a ratio (molar ratio) of each of the metal elements that are contained is substantially equal to a ratio of each of metal elements in the powder raw materials that are mixed during the manufacturing.

After the respective powder raw materials are weighed and mixed in such a manner that a mixing ratio of each of the powder raw materials becomes the above-described value, an organic binder, a plasticizer, a dispersing agent, and a solvent are further added to the powder raw materials, and then the resultant materials are mixed with each other to prepare ceramic slurry. Then the ceramic slurry is casted into a sheet shape to obtain a ceramic green sheet. A plurality of the ceramic green sheets that are obtained are laminated and compressed according to necessity, whereby a laminated body is prepared. The ceramic laminated body that is obtained is burned out the binder, and is fired under a non-oxidation atmosphere to obtain the alumina sintered body of this embodiment. An example of the non-oxidation atmosphere includes a mixed gas of humidified hydrogen and nitrogen. Alternatively, the firing may be performed under vacuum or in an inert gas such as argon gas as long as the atmosphere is a non-oxidation atmosphere. In addition, for example, the firing temperature may be set to 1,450 to 1,700° C.

In the alumina sintered body of this embodiment, the reason why the additive amount of titanium (Ti) may be suppressed by further adding lanthanum (La) or the like is considered to be as follows. That is, in the alumina sintered body of this embodiment, in the firing process during the manufacturing, a titanium compound that makes up the powder raw material reacts with a lanthanum compound, a neodymium compound, or a cerium compound that makes up the powder raw material, and thus a compound having a melting point lower than a firing temperature is generated. In the firing process, a grain of alumina ($Al_2O_3$) is grown. However, at this time, it is considered that the low melting point compound containing the above-described titanium enters a liquid-phase state, and spreads out between alumina particles (grain boundary). On the other hand, in a composition system composed of only the aluminum oxide and the titanium oxide, the aluminum oxide, the titanium oxide, and a compound that is generated through reaction between the aluminum oxide and the titanium oxide have a melting point higher than the firing temperature, and in the firing process, do not enter the liquid-phase state and do not spread out between the alumina particles. In addition, as described above, when the firing is performed under a non-oxidation atmosphere, at least a part of titanium, which are contained in the low melting point compound that spreads out to the alumina grain boundary, is reduced, and thus an electron path is formed in the alumina grain boundary. As described above, in this embodiment, lanthanum and the like are further added, and thus the low melting point compound that contains titanium is generated during the firing, and it is easy to make titanium-containing compound spread out to the alumina grain boundary. Accordingly, since at least a part of the titanium compound that spreads out to the grain boundary is reduced and thus the electron path is formed, even when the additive amount of titanium is suppressed, it is considered that desired volume resistivity may be realized in the alumina sintered body. In addition, when the firing is performed under an oxidation atmosphere such as in the air differently from the method for manufacturing the alumina sintered body of this embodiment, the low melting point compound that spreads out to the alumina grain boundary is not reduced, and a sufficient electron path is not formed. Therefore, in the case of performing the firing under the oxidation atmosphere, even when the composition of the alumina sintered body is set within the above-described range, the volume resistivity of the alumina sintered body, which may be obtained, becomes larger than the volume resistivity of the alumina sintered body of this embodiment.

In addition, in the alumina sintered body of this embodiment, since the firing is performed under the non-oxidation atmosphere as described above, when the alumina sintered body is used to form, for example, a member having an metal interconnection at the inside or on a surface thereof, a manufacturing process may be simplified. Specifically, a firing process for manufacturing the alumina sintered body and a process of firing metalize that forms the metal interconnection may be simultaneously performed.

In addition, in the alumina sintered body of this embodiment, when lanthanum (La) and the like are further added, the low melting point compound enters a liquid-phase state and spreads out between alumina particles, and thus sintering is further promoted. As a result, the alumina sintered body may be formed in a relatively dense manner. Accordingly, even when the firing is performed at a normal pressure (atmospheric pressure) without particularly pressing the sintered body, a sufficiently dense alumina sintered body may be obtained.

With Regard to Contained Amount of Al

In the alumina sintered body of this embodiment, as described above, aluminum (Al) is contained in an amount in which a ratio of aluminum oxide ($Al_2O_3$) to the total oxides when converting the metal elements contained in the alumina sintered body into oxides and summing the oxides becomes 93.00 to 99.85% by weight, and more preferably 98.00 to 99.85% by weight. Here, when the ratio of the aluminum oxide to the total oxides is set to be less than 93.00% by weight, an amount of an additive in the alumina sintered body, specifically, a metal element other than aluminum increases. Therefore, an amount of particles, which are generated when the alumina sintered body is exposed to plasma, increases, and when the alumina sintered body is used as a constituent member of the semiconductor manufacturing apparatus, an effect on a semiconductor wafer becomes considerable. Therefore, this range is not preferable. Particularly, when it needs to reduce the amount of particles, it is effective for the ratio of the aluminum oxide to the total oxides to be set to 98.00% by weight or more. In addition, in a case where the ratio of the aluminum oxide to the total oxides exceeds 99.85% by weight, an amount of titanium, or at least one kind of element selected from lanthanum, neodymium, and cerium, which are added to manufacture the alumina sintered body, decreases. Therefore, in the alumina sintered body, since formation of the electron path due to titanium is suppressed and the volume resistivity of the alumina sintered body relatively increases, this range is not preferable.

With Regard to Contained Amount of Ti

In the alumina sintered body of this embodiment, as described above, titanium (Ti) is contained in an amount in which a ratio of titanium oxide ($TiO_2$) to the total oxides when converting the metal elements contained in the alumina sintered body into oxides and summing the oxides becomes 0.1 to 2.0% by weight. Here, when the ratio of the titanium oxide to the total oxides is set to be less than 0.1% by weight, it is difficult to sufficiently secure the amount of titanium that has a relationship with the formation of the electron path in the alumina sintered body, and thus the volume resistivity relatively increases. Therefore, this range is not preferable. In addition, in a case where the ratio of the titanium oxide to the total oxides exceeds 2.0% by weight, the amount of titanium, which has a relationship with the formation of the electron path in the alumina sintered body, becomes excessive, and thus the volume resistivity relatively decreases. Therefore, this range is not preferable.

With Regard to Contained Amount of La, Nd, and Ce

In the alumina sintered body of this embodiment, as described above, lanthanum (La), neodymium (Nd), and cerium (Ce) are contained in a total amount in which a ratio of a total amount of lanthanum oxide ($La_2O_3$), neodymium oxide ($Nd_2O_3$) and cerium oxide ($CeO_2$) to the total oxides when converting the metal elements contained in the alumina sintered body into oxides and summing the oxides becomes 0.05 to 5.00% by weight. Here, when the ratio of the total amount of the lanthanum oxide, the neodymium oxide, and the cerium oxide to the total oxides is set to be less than 0.05% by weight, formation of the titanium-containing compound having the low melting point becomes insufficient in the firing process during manufacturing of the alumina sintered body, and thus the formation of the electron path due to titanium is suppressed. As a result, since the volume resistivity of the alumina sintered body relatively increases, and thus this range is not preferable. In addition, in a case where the ratio of the total amount of the lanthanum oxide, the neodymium oxide, and the cerium oxide to the total oxides exceeds 5.00% by weight, an amount of the additive in the alumina sintered body, specifically, a metal element other than aluminum increases. Therefore, an amount of particles, which are generated when the alumina sintered body is exposed to plasma, increases, and when the alumina sintered body is used as a constituent member of the semiconductor manufacturing apparatus, an effect on a semiconductor wafer becomes considerable. Therefore, this range is not preferable.

In the alumina sintered body of this embodiment, it is preferable that a molar ratio of the total of lanthanum (La), neodymium (Nd), and cerium (Ce) to titanium (Ti), which are contained in the alumina sintered body, be set to be larger than 0.03 and is less than 5.00. When the molar ratio is set to be larger than 0.03, in the firing process during the manufacturing of the alumina sintered body, the titanium-containing compound having a melting point lower than a firing temperature is sufficiently formed, and sintering is promoted due to the low melting point compound. Accordingly, the alumina sintered body may be sufficiently dense (sintering properties are secured), and thus this range is preferable. In addition, when the molar ratio is set to be less than 5.00, an irregularity of a color tone in external appearance of the alumina sintered body may be suppressed, and thus this range is preferable.

With Regard to Other Additive Metals

The alumina sintered body of this embodiment may contain at least one kind of element selected from magnesium (Mg), calcium (Ca), strontium (Sr), barium (Ba), and silicon (Si). In this case, it is preferable that magnesium (Mg), calcium (Ca), strontium (Sr), barium (Ba), and silicon (Si) be contained in amounts in which ratios of magnesium oxide (MgO), calcium oxide (CaO), strontium oxide (SrO), barium oxide (BaO), and silicon oxide ($SiO_2$) to the total oxides are all 1.0% by weight or less, respectively, where the total oxides represent a combined amount of oxides that are converted from metal elements contained in the alumina sintered body. When the alumina sintered body contains at least one kind of element selected from magnesium, calcium, strontium, barium, and silicon, and the ratios thereof are set to 1.0% by weight or less, respectively, the volume resistivity at room temperature of the alumina sintered body may be further easily adjusted within a range of $1 \times 10^5$ to $1 \times 10^{12}$ Ω·cm. In addition, in a case where the additive amount of at least one kind of element selected from magnesium, calcium, strontium, barium, and silicon is suppressed within the above-described range, when the alumina sintered body is used as the constituent member of the semiconductor manufacturing apparatus, contamination of a semiconductor wafer, which is caused by the addition of the above-described elements, may be suppressed. In the alumina sintered body of this embodiment, the metal elements, which are contained, other than aluminum (Al) and titanium (Ti) may include only at least one kind of element selected from lanthanum (La), neodymium (Nd), and cerium (Ce), and at least one kind of element selected from magnesium (Mg), calcium (Ca), strontium (Sr), barium (Ba), and silicon (Si).

As described above, in the alumina sintered body, the volume resistivity of the alumina sintered body may be adjusted by the amount of titanium that is added. A corresponding relationship between the volume resistivity of the alumina sintered body and the additive amount of titanium may be made to vary by further adding at least one kind of element selected from magnesium, calcium, strontium, barium, and silicon to the alumina sintered body. Specifically, a level of the volume resistivity of the alumina sintered body, which corresponds to the amount of titanium that is added, may be decreased as a whole by further adding silicon to the alumina sintered body of this embodiment. At this time, the larger the amount of silicon that is added to the alumina sintered body, the further an extent of decreasing the level of the volume resistivity of the alumina sintered body increases. Accordingly, when silicon is further added, the volume resistivity of the alumina sintered body may be adjusted to a desired value without increasing the additive amount of titanium.

In addition, the level of the volume resistivity of the alumina sintered body, which corresponds to the additive amount of titanium, may be increased as a whole by further adding at least one kind of element (hereinafter, also referred to as "magnesium or the like") selected from magnesium, calcium, strontium, and barium to the alumina sintered body of this embodiment. At this time, the larger the amount of magnesium or the like that is added to the alumina sintered body, the further an extent of increasing the level of the volume resistivity of the alumina sintered body increases. Accordingly, when magnesium or the like is further added, a fine adjustment of the contained amount of each element, which is performed to adjust the volume resistivity of the alumina sintered body to a desired value, may be further easily realized.

As described above, at least one kind of element selected from magnesium, calcium, strontium, barium, and silicon has an effect of adjusting a value of the volume resistivity of the alumina sintered body to a desired value. However, in a case of using the alumina sintered body of this embodiment as a member for the semiconductor manufacturing apparatus, with respect to a fluoride-based gas that is frequently used as an general etching gas of a silicon wafer, silicon oxide ($SiO_2$) is easily corroded by plasma compared to magnesium oxide (MgO), calcium oxide (CaO), strontium oxide (SrO), barium oxide (BaO) Accordingly, as the additive element, it is preferable to use at least one kind element selected from magnesium, calcium, strontium, and barium instead of using silicon from the viewpoints that corrosion is less, and thus corrosion resistance of the alumina sintered body is improved.

With Regard to Configuration Example of Electrostatic Chuck

The alumina sintered body of this embodiment may be suitably used to prepare an electrostatic chuck. Here, the electrostatic chuck represents a member that performs fixing and conveying of a semiconductor wafer in the semiconductor manufacturing apparatus (for example, an etching apparatus, an ion implanting apparatus, an electron beam exposure apparatus, or the like) that manufactures the semiconductor wafer. The alumina sintered body of this embodiment may be suitably used, particularly, in a Johnson-Rahbeck type (JR type) electrostatic chuck.

FIG. 1 shows a schematic cross-sectional diagram illustrating a configuration of the electrostatic chuck using the alumina sintered body of this embodiment. The electrostatic chuck 10 shown in FIG. 1 is provided with a dielectric layer 12, internal electrodes 13 and 14, and a base material 15. The dielectric layer 12 is constructed by the alumina sintered body of this embodiment. One surface of the dielectric layer 12 serves as a chuck surface 17 to which a semiconductor wafer is suctioned. The base material 15 is joined to the other surface of the dielectric layer 12. For example, the base material 15 may be constructed by aluminum or an aluminum alloy. A gas tunnel 16 is formed inside the electrostatic chuck 10 across the inside of the dielectric layer 12 and the inside of the base material 15. The gas tunnel 16 is a flow path through which a cooling gas such as helium (He) is supplied from the base material 15 side to the chuck surface 17 side so as to cool down the semiconductor wafer that is held on the chuck surface 17. A power supply 19 is connected to the internal electrodes 13 and 14, and when a direct voltage is applied between the internal electrodes 13 and 14, an electrostatic attraction force for suctioning the semiconductor wafer may be generated.

In the electrostatic chuck, suction and release properties during suction and release of the semiconductor wafer depend on the volume resistivity of the dielectric layer 12, and thus it is necessary to appropriately set the volume resistivity of the dielectric layer 12. The electrostatic chuck 10 is the JR type electrostatic chuck, and thus it is preferable that the volume resistivity at room temperature of the alumina sintered body that constructs the dielectric layer 12 be set to $1 \times 10^8$ to $1 \times 10^{12}$ Ω·cm. To realize this volume resistivity, it is preferable that a ratio of the aluminum oxide ($Al_2O_3$) to total oxides when converting the metal elements contained in the alumina sintered body into oxides and summing the oxides be 95.00% by weight or more so as to reduce an amount of metal elements that are contained in the alumina sintered body other than aluminum. In addition, it is preferable that titanium (Ti) be contained in an amount in which a ratio of titanium oxide ($TiO_2$) to total oxides when converting the metal elements contained in the alumina sintered body into oxides and summing the oxides becomes 0.1 to 1.5% by weight. In addition, it is preferable that lanthanum, neodymium, and cerium be contained in a total amount in which a ratio of a total amount of the lanthanum oxide, the neodymium oxide, and the cerium oxide to the total oxides when converting the metal elements contained in the alumina sintered body into oxides and summing the oxides becomes 0.05 to 2.00% by weight.

When preparing the electrostatic chuck 10 using the alumina sintered body of this embodiment, for example, the dielectric layer 12 may be prepared by laminating the above-described ceramic green sheet. At this time, if a pattern corresponding to the internal electrodes 13 and 14 is printed on the ceramic green sheet in advance by using a metalize ink, the alumina sintered body and the internal electrodes 13 and 14 may be simultaneously completed by performing the firing under a non-oxidization atmosphere. In addition, in a case of preparing the dielectric layer 12 by laminating the ceramic green sheet, a hole corresponding to a shape of the gas tunnel 16 may be provided to each ceramic green sheet to be laminated. It is possible to make the alumina sintered body of this embodiment sufficiently dense through firing at a normal pressure, and thus the firing under pressure is not necessary in a process of manufacturing the dielectric layer 12, and a vacant space structure such as the gas tunnel 16 may be provided without any problem. In addition, various modifications may be made to a configuration of the electrostatic chuck 10. For example, the gas tunnel 16 may not be provided, or a heater may be further provided. In addition, a configuration of the internal electrodes may be a monopolar-electrode type instead of a bipolar-electrode type.

With Regard to Configuration Example of Member Having Static Electricity Removal Function The alumina sintered body of this embodiment may be suitably used to form a member that constructs a component having a static electricity removal function. Examples of the component having the static electricity removal function include a component for the semiconductor manufacturing apparatus, and more specifically, a component for the semiconductor manufacturing apparatus that is used in a plasma chamber. Here, examples of the component having the static electricity removal function for the semiconductor manufacturing apparatus include components, which are used in the plasma chamber, such as a conveying arm, a handling jig, a wafer conveying tweezers, and a wafer lifter pin.

Figure 2:
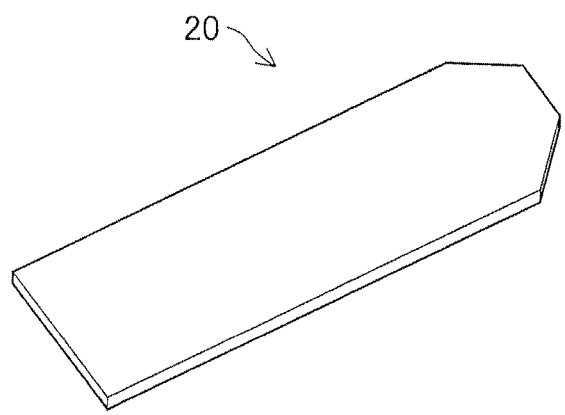
FIG. 2 is a perspective diagram illustrating an example of external appearance of a conveying arm.

FIG. 2 shows a perspective diagram illustrating external appearance of a conveying arm 20 as an example of the conveying arm using the alumina sintered body of this embodiment. In this manner, when the member having the static electricity removal function for the semiconductor manufacturing apparatus is formed by the alumina sintered body of this embodiment, a sufficient static electricity removal function may be realized in the semiconductor manufacturing apparatus. In addition, in a process of manufacturing a semiconductor, contamination of a semiconductor wafer, which is caused by particles that are generated due to exposure to plasma, may be suppressed.

In a case of forming the member having the static electricity removal function for the semiconductor manufacturing apparatus by using the alumina sintered body of this embodiment, it is preferable that the volume resistivity of the alumina sintered body at room temperature be set to $1 \times 10^5$ to $1 \times 10^{10}$ Ω·cm. To realize this volume resistivity, it is preferable that a ratio of aluminum oxide ($Al_2O_3$) to total oxides when converting the metal elements contained in the alumina sintered body into oxides and summing the oxides be 93.00% by weight or more so as to reduce an amount of metal elements that are contained in the alumina sintered body other than aluminum. In addition, it is preferable that titanium (Ti) be contained in an amount in which a ratio of the titanium oxide ($TiO_2$) to total oxides when converting the metal elements contained in the alumina sintered body into oxides and summing the oxides becomes 0.3 to 1.8% by weight. In addition, it is preferable that lanthanum, neodymium, and cerium be contained in a total amount in which a ratio of a total amount of the lanthanum oxide, the neodymium oxide, and the cerium oxide to total oxides when converting the metal elements contained in the alumina sintered body into oxides and summing the oxides becomes 0.1 to 4.5% by weight. In addition, when volume resistivity at room temperature of the alumina sintered body of this embodiment is set to $1\times10^5$ to $1\times10^{10}$ Ω·cm, the member including the alumina sintered body may be suitably used as the member having the static electricity removal function in other usage than as the semiconductor manufacturing apparatus.

With Regard to Analysis Method of Alumina Sintered Body

A contained amount of each of the metal elements in the alumina sintered body may be measured by, for example, ICP atomic emission spectrophotometry (high frequency inductively coupled plasma atomic emission spectrophotometry). When obtaining the contained amount of each of the elements in the alumina sintered body in terms of an oxide, first, the contained amount of each of the metal elements is measured by the above-described method, and a total amount (total amount in terms of an oxide) of total oxides when assuming that each of the metal elements is present as an oxide is obtained based on the measurement results. Then, with respect to each of the metal elements, a ratio of an amount thereof in terms of an oxide to the total amount of the respective metal elements in terms of an oxide may be obtained. In addition, the volume resistivity of the alumina sintered body may be measured by a three-terminal method that is well known as a resistance value measuring method of an insulating member.

EXAMPLES

Hereinafter, the invention will be described in more detail referring to examples, but the invention is not limited to the description of these examples.

FIG. 3 shows an explanatory diagram illustrating preparation results of 40 kinds of alumina sintered bodies from Sample 1 to Sample 40 as a table. In addition, FIG. 4 shows an explanatory diagram illustrating preparation results of 20 kinds of alumina sintered bodies from Sample 41 to Sample 60 as a table. Hereinafter, a configuration and a manufacturing method of each of the samples, and evaluation results of each of the samples will be described.

A. Preparation of Each Sample

Samples 1 to 10, and 37 to 41 represent alumina sintered bodies that contain aluminum (Al), titanium (Ti), and lanthanum (La) as a metal element. Samples 11 to 20 represent alumina sintered bodies that further contain silicon (Si) as the metal element in addition to aluminum, titanium, and lanthanum. Samples 21 to 24, and 42 to 52 represent alumina sintered bodies that further contain magnesium (Mg) as the metal element in addition to aluminum, titanium, and lanthanum. Samples 25 to 30, 33, and 34 represent alumina sintered bodies that further contain silicon and magnesium as the metal element in addition to aluminum, titanium, and lanthanum. Sample 31 represents an alumina sintered body that further contains silicon and magnesium as the metal element in addition to aluminum, titanium, and cerium (Ce). Sample 32 represents an aluminum sintered body that further contains silicon and magnesium as the metal element in addition to aluminum, titanium, and neodymium (Nd). Sample 53 represents an aluminum sintered body that further contains magnesium and calcium (Ca) as the metal element in addition to aluminum, titanium, and lanthanum. Samples 54 and 55 represent alumina sintered bodies that further contain calcium as the metal element in addition to aluminum, titanium, and lanthanum. Sample 56 represents an alumina sintered body that further contains magnesium and barium (Ba) as the metal element in addition to aluminum, titanium, and lanthanum. Samples 57 and 58 represent alumina sintered bodies that further contain barium as the metal element in addition to aluminum, titanium, and lanthanum. Sample 59 represents an alumina sintered body that further contains magnesium as the metal element in addition to aluminum, titanium, and neodymium. Sample 60 represents an alumina sintered body that further contains strontium (Sr) as the metal element in addition to aluminum, titanium, and lanthanum. Samples 35 and 36 represent alumina sintered bodies that contain aluminum and titanium as the metal element.

Each of the samples was prepared by a solid-phase reaction method. As a powder material that was provided to the solid-phase reaction method, an aluminum oxide ($Al_2O_3$) powder, a titanium oxide ($TiO_2$) powder, a lanthanum hydroxide ($La(OH)_3$) powder, a neodymium oxide ($Nd_2O_3$) powder, a cerium oxide ($CeO_2$) powder, a silicon oxide ($SiO_2$) powder, a magnesium carbonate ($MgCO_3$) powder, a calcium carbonate ($CaCO_3$) powder, a barium carbonate ($BaCO_3$) powder, and a strontium carbonate ($SrCO_3$) powder were used. As the aluminum oxide ($Al_2O_3$) powder, a powder having an average particle size of 2.8 μm and purity of 99.9% was used. Necessary raw material powders corresponding to each composition shown in FIG. 3 were selected from the raw material powders, and the selected raw material powders were weighed and mixed to realize each composition ratio shown in FIG. 3. That is, the raw material powders were mixed in such a manner that a ratio of an amount of each element in terms of an oxide to a total amount of total oxides when converting the metal elements contained in each sample into oxides and summing the oxides became a value shown in FIG. 3.

After the raw material powders were mixed, an organic binder (a butyral resin), a plasticizer, a dispersing agent, and an organic solvent were further mixed to the resultant mixture to prepare ceramic slurry. Then, the ceramic slurry was casted into a sheet shape to obtain a ceramic green sheet. A plurality of the ceramic green sheets that were obtained were laminated and compressed to prepare a laminated body. The ceramic laminated body that was obtained was burned out the binder, and was fired under a non-oxidation atmosphere (in a mixed gas of humidified hydrogen and nitrogen at 1550° C. for four hours) to obtain each of the samples.

B. Evaluation on Each Sample

The volume resistivity of each of the samples was measured by a three-terminal method. Specifically, disk-shaped measurement sample having a diameter of 20 mm and a thickness of 1 mm was cut from each of the fired samples, a Pt electrode for three-terminal measurement was screen printed on front and rear surfaces of each measurement sample and heat treated to fix the electrode, and the volume resistivity was measured. Here, a gas atmosphere during the heat treatment to fix the electrode was set to be the same as an atmosphere during the firing. Measurement results of the volume resistivity of each sample are shown in FIGS. 3 and 4. In addition, the electrode may be formed by a sputtering method or the like using gold (Au) or the like instead of screen printing method so as not to be affected by the atmosphere during the heat treatment to fix the electrode.

In addition, with respect to each sample, a molar ratio ((La+Nd+Ce)/Ti) of the total of lanthanum, neodymium, and cerium to titanium is shown in FIGS. 3 and 4. The molar ratio shown in FIGS. 3 and 4 is a value obtained based on an amount of each metal element in the raw material powders used during manufacturing of each sample. Furthermore, results, which were obtained by measuring a bulk density and a water content of each sample using the Archimedes' method, are shown in FIGS. 3 and 4. The Archimedes' method is a well known method in which a solid sample is immersed in a liquid (here, water) of which density is known and a density is calculated based on buoyancy which the sample receives. An expression to obtain the bulk density and an expression to obtain the water content are shown below as Expression (1) and Expression (2), respectively. In addition, in the following expressions, a wet weight represents a value that is obtained in such a manner that water is impregnated into pores formed in each sample under a reduced pressure, and then a weight of each sample is measured in the air.

Bulk density (g/cm³)=dry weight (g)÷(wet weight (g)−weight in water (g))×density of water (g/cm³)  (1)

Water content (vol. %)=(1−(dry weight (g)−weight in water (g))÷(wet weight (g)−weight in water (g)))×100  (2)

Furthermore, with respect to each sample, external appearance was observed by visual observation and evaluation was made with respect to whether or not an irregularity of color tone was present. Evaluation on whether or not the irregularity of the color tone was present is shown in FIGS. 3 and 4.

As shown in FIGS. 3 and 4, in Samples 1 to 34, and 41 to 60, volume resistivity of $1\times10^5$ to $1\times10^{12}$ Ω·cm was obtained. That is, it was confirmed that a sample, which satisfied conditions in which when converting metal elements into oxides, a contained ratio of aluminum was 93.00 to 99.85% by weight, a contained ratio of titanium was 0.10 to 2.00% by weight, and a contained ratio of an element selected from lanthanum, neodymium, and cerium was 0.05 to 5.00% by weight, exhibited the volume resistivity within the above-described range.

Conversely, even when the contained ratio of aluminum was within a range of 93.00 to 99.85% by weight, and the contained ratio of titanium was within a range of 0.1 to 2.0% by weight at the time of converting the metal elements into oxides, in a case where any of lanthanum, neodymium, and cerium was not contained, the volume resistivity exceeded $1\times10^{12}$ Ω·cm (refer to Samples 35 and 36). In addition, even when lanthanum was contained, in a case in which the contained ratio of lanthanum was less than 0.05% by weight in terms of an oxide, the volume resistivity exceeded $1\times10^{12}$ Ω·cm (refer to Samples 37 and 38). In addition, even when the contained ratio of lanthanum was within a range of 0.05 to 5.00% by weight in terms of an oxide, in a case where the contained ratio of titanium was less than 0.1% by weight in terms of an oxide, the volume resistivity exceeded $1\times10^{12}$ Ω·cm (refer to Sample 39). Furthermore, even when the contained ratio of lanthanum was within a range of 0.05 to 5.00% by weight in terms of an oxide, in a case where the contained ratio of titanium in terms of an oxide exceeded 2.0% by weight, the volume resistivity was less than $1\times10^5$ Ω·cm (refer to Sample 40).

In addition, as shown in FIG. 3, in the alumina sintered bodies in which a molar ratio of the total of lanthanum, neodymium, and cerium to titanium was 0.03 or less, it was confirmed that sintering properties deteriorated. That i the bulk density was lower (3.85 (g/cm³) or less), and the water content was larger (0.1% or more) compared to other samples (refer to Samples 4, 35, 36, and 38). In addition, in the alumina sintered bodies in which the total molar ratio of lanthanum, neodymium, and cerium to titanium was 5.74 or more, it was confirmed that the irregularity of the color tone in the external appearance was easy to occur (refer to Samples 6, 8, 21, 22, and 39).

C. Evaluation on Generated Phase by EPMA/WDS

Figure 5A:
FIGS. 5A to 5D are explanatory diagrams illustrating results of measurement that is performed using EPMA/WDS.
Figure 5B:
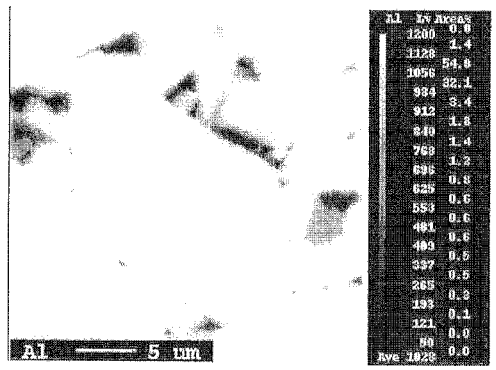
Figure 5C:
Figure 5D:
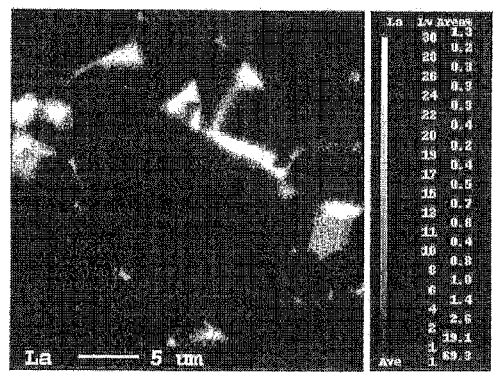

FIGS. 5A to 5D show explanatory diagrams illustrating results that are obtained by mirror-polishing each alumina sintered body that was prepared and by performing a measurement using EPMA (electron probe microanalyzer)/WDS (wavelength dispersive X-ray spectroscopy). Here, measurement results with respect to Sample 27 are shown as an example. FIG. 5A shows a backscattered electron image when viewed by an electron microscope, and a kind of an element provided to each region is expressed by gradation. FIGS. 5B to 5D show color maps of the EPMA with respect to the same region as FIG. 5A. Specifically, FIG. 5B shows a distribution of aluminum, FIG. 5C shows a distribution of titanium, and FIG. 5D shows a distribution of lanthanum.

From FIGS. 5A to 5D, since the region expressed by a black color in FIG. 5A mainly contained aluminum as the metal element and the crystal phase of aluminum oxide ($Al_2O_3$) was confirmed by XRD, this region was considered as a crystal phase of the aluminum oxide. In addition, since a region expressed by a white color was present at a grain boundary of the crystal phase mainly containing aluminum as the metal element, this region was considered as phases of oxides containing aluminum, titanium, and lanthanum. As described above, the phases of the oxides containing aluminum, titanium, and lanthanum were observed at the grain boundary of the crystal phase of the aluminum oxide mainly containing aluminum as the metal element in Samples 1 to 26, 28 to 30, 33 to 34, 41 to 58, and 60 other than Sample 27 in a similar manner. In addition, in Sample 31, phases of oxides containing aluminum, titanium, and cerium were observed in a similar manner. In Samples 32 and 59, phases of oxides containing aluminum, titanium, and neodymium were observed in a similar manner. In this manner, in the alumina sintered bodies, it was confirmed that a titanium-containing oxide spread out to the crystal grain boundary of the aluminum oxide. In addition, although not detected by EPMA, it was considered that the titanium-containing oxide was present, and an electron path was formed even in a place, which was not clearly shown as the white color area in FIG. 5A, of the crystal grain boundary of the aluminum oxide.

D. Evaluation on Effect of Silicon and Magnesium

Figure 6:
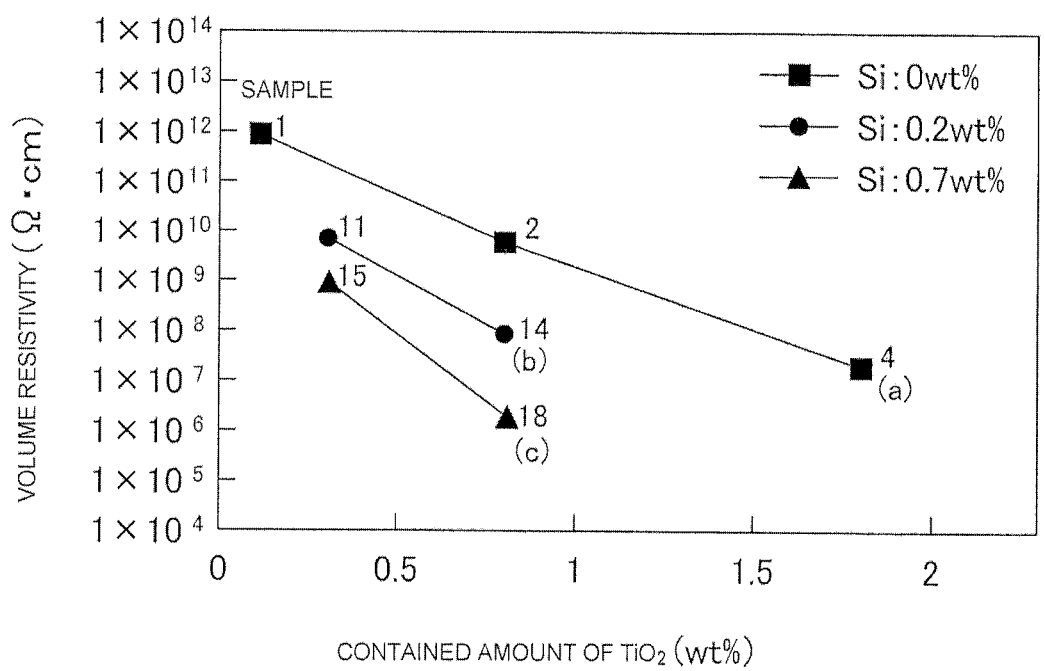
FIG. 6 is an explanatory diagram of results of examination about an effect of silicon in the alumina sintered body.

FIG. 6 shows an explanatory diagram illustrating results of examination about an effect of silicon on a relationship between the contained amount of titanium in terms of an oxide (described as a contained amount of $TiO_2$ in FIG. 6) and the volume resistivity in the alumina sintered bodies. FIG. 6 illustrates results related to samples containing lanthanum in the same contained ratio (the contained ratio of lanthanum when converting metal elements into oxides was 0.07% by weight). A graph (a) in FIG. 6 relates to the alumina sintered body to which silicon is not added, and shows plotted results of Samples 1, 2, and 4 shown in FIG. 3. In addition, in graphs shown in FIG. 6 and FIG. 7 to be described later, sample numbers are added to points corresponding to samples shown in FIG. 3. A graph (b) in FIG. 6 shows results with respect to Samples 11 and 14 in which the contained ratio of silicon when converting the metal elements into oxides is 0.20% by weight. In addition, a graph (c) shows results with respect to Samples 15 and 18 in which the contained ratio of silicon when converting the metal elements into oxides is 0.70% by weight.

Figure 7:
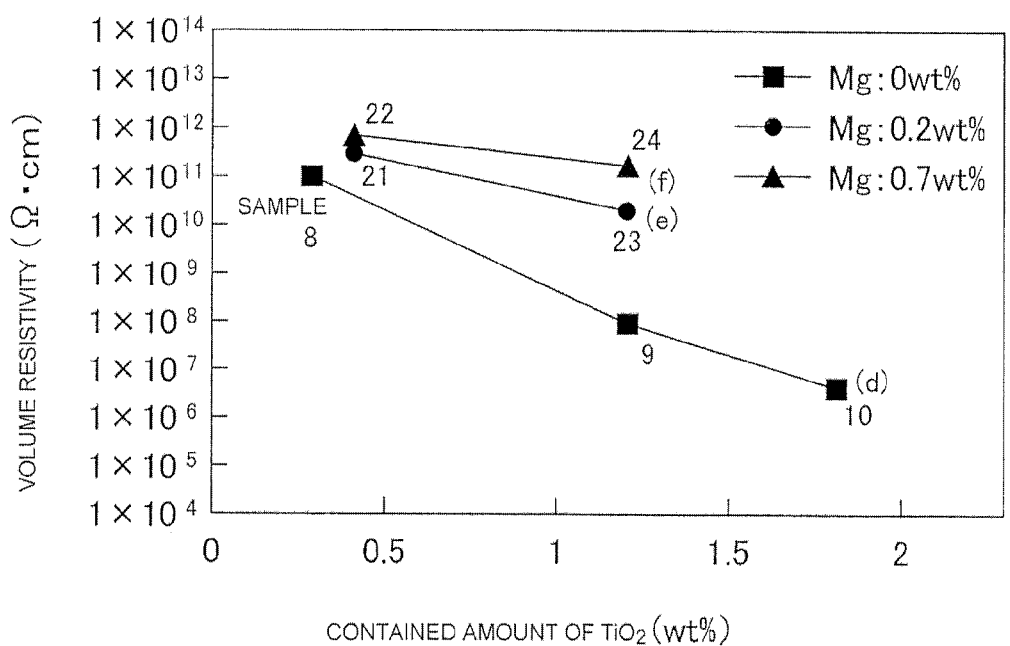
FIG. 7 is an explanatory diagram of results of examination about an effect of magnesium in the alumina sintered body.

FIG. 7 shows an explanatory diagram illustrating results of examination about an effect of magnesium on a relationship between the contained amount of titanium in terms of an oxide (described as a contained amount of $TiO_2$ in FIG. 7) and the volume resistivity in the alumina sintered bodies. FIG. 7 illustrates results related to samples containing lanthanum in the same contained ratio (the contained ratio of lanthanum when converting metal elements into oxides was 4.80% by weight). A graph (d) in FIG. 7 relates to the alumina sintered body to which magnesium is not added, and shows plotted results of Samples 8, 9, and 10 shown in FIG. 3. A graph (e) in FIG. 7 shows results with respect to Samples 21 and 23 in which the contained ratio of magnesium when converting the metal elements into oxides is 0.20% by weight. In addition, a graph (f) in FIG. 7 shows results with respect to Samples 22 and 24 in which the contained ratio of magnesium when converting the metal elements into oxides is 0.70% by weight.

As shown in FIGS. 6 and 7, in the alumina sintered bodies, as the contained ratio of titanium increases, there is a tendency for the volume resistivity to be low. At this time, as shown in FIG. 6, in a case where silicon was further added, it was confirmed that as the additive amount of silicon increased, a level of the volume resistivity decreased as a whole. That is, when the alumina sintered body exhibiting desired volume resistivity was obtained by further adding silicon, it was confirmed that the additive amount of titanium could be reduced. In addition, as shown in FIG. 6, it was confirmed that any one of cases in which the contained ratio of silicon when converting the metal elements into oxides was 0.20% by weight and 0.70% by weight, respectively, was useful to obtain the alumina sintered body having the volume resistivity within a range of $1\times10^5$ to $1\times10^{12}$ Ω·cm.

In addition, as shown in FIG. 7, in a case of further adding magnesium, it was confirmed that the more the additive amount of magnesium increased, the further the level of the volume resistivity raised as a whole. Furthermore, it was confirmed that an incline in a graph illustrating the volume resistivity corresponding to the contained ratio of titanium became relatively smaller by further adding magnesium. Accordingly, when adjusting the volume resistivity of the alumina sintered body by the contained ratio of titanium, it was considered that a minute adjustment of the volume resistivity became relatively easier by further adding magnesium. In addition, as shown in FIG. 7, it was confirmed that anyone of cases in which the contained ratio of magnesium when converting the metal elements into oxides was 0.20% by weight and 0.70% by weight, respectively, was useful to obtain the alumina sintered body having the volume resistivity within a range of $1\times10^5$ to $1\times10^{12}$ Ω·cm.

E. Manufacturing of Electrostatic Chuck

An electrostatic chuck (refer to FIG. 1) was prepared using the alumina sintered body having the same element composition as Sample 3. Specifically, the above-described ceramic green sheet was prepared to have the same element composition as Sample 3. The ceramic green sheet that was obtained was cut to have a predetermined size, and mechanical punching or drill processing was performed to form a via hole, a penetration hole configured to form a terminal connection portion, and the like. Furthermore, metalize containing tungsten (W) or molybdenum (Mo) as a main component was filled in the via hole to form a via interconnection. In addition, metalize containing tungsten or molybdenum as a main component was applied onto a surface of the ceramic green sheet by screen printing to form an electrode or a metal interconnection. A plurality of the ceramic green sheets that were processed in this manner were laminated and compressed, a groove was formed on a surface of the resultant laminated body by end milling, and the resultant laminated body was laminated on another laminated body and these laminated bodies were compressed. Then, external appearance of the resultant laminated body was processed to have a predetermined shape, whereby a laminated precursor having a gas tunnel or a metal interconnection formed at the inside thereof was obtained.

After a binder burnout process, the laminated precursor was fired in a mixed gas of humidified hydrogen and nitrogen at 1550° C. for four hours to obtain the alumina sintered body. This alumina sintered body was subjected to abrasive machining to have a predetermined shape, whereby a ceramic substrate for the electrostatic chuck was obtained. The ceramic substrate for the electrostatic chuck, which was obtained, was bonded to an aluminum base material 15 with an adhesive, and a metallic conductive terminal was soldered thereto, whereby the electrostatic chuck was obtained. This electrostatic chuck was installed in an evaluation apparatus, and a voltage was applied to an electrode of the electrostatic chuck in a state in which a silicon wafer was placed under vacuum. From this, it was confirmed that the silicon wafer was suctioned by the electrostatic chuck and the electrostatic chuck satisfactory functioned.

In addition, the volume resistivity of the electrostatic chuck that was manufactured was measured. Specifically, a test specimen was cut from the electrostatic chuck that was manufactured, and the volume resistivity was measured by a three-terminal method. That is, a disk-shaped measurement sample having a diameter of 20 mm and a thickness of 1 mm was cut from the electrostatic chuck that was manufactured, a Pt electrode for three-terminal measurement was screen printed on front and rear surfaces of each measurement sample and heat treated to fix the electrode, and the volume resistivity was measured. In addition, a gas atmosphere during the heat treatment to fix the electrode was set to be the same as an atmosphere during the firing to obtain the alumina sintered body. As a result, similarly to Sample 3, it was confirmed that the volume resistivity of $8\times10^8$ Ω·cm was exhibited, and the volume resistivity appropriate for the JR type electrostatic chuck was exhibited. In addition, the measurement sample may be prepared by forming the electrode by a sputtering method or the like using gold (Au) or the like instead of the screen printing method so as not to be affected by the atmosphere during the heat treatment to fix the electrode.

F. Manufacturing Member Having Static Electricity Removal Function for Semiconductor Manufacturing Apparatus A conveying arm (refer to FIG. 2) was prepared by using the alumina sintered body having the same element composition as Sample 26. Specifically, the above-described ceramic slurry was prepared to have the same element composition as Sample 26. Granulated powders were obtained using the ceramic slurry that was obtained by a spray dry method, and these granulated powders were molded to have a predetermined shape by a pressing method. After a binder burnout process, a molded body that was obtained was fired in a mixed gas of humidified hydrogen and nitrogen at 1550° C. for four hours to obtain the alumina sintered body. This alumina sintered body was subjected to abrasive machining to have a shape corresponding to a conveying arm for the semiconductor manufacturing apparatus.

A test specimen was cut from the alumina sintered body, which was obtained, for the conveying arm, and then the volume resistivity was measured by a three-terminal method.

That is, a disk-shaped measurement sample having a diameter of 20 mm and a thickness of 1 mm was cut from the alumina sintered body, which was manufactured, for the conveying arm, a Pt electrode for three-terminal measurement was screen printed on front and rear surfaces of each measurement sample and heat treated to fix the electrode, and the volume resistivity was measured. In addition, a gas atmosphere during the heat treatment to fix the electrode was set to be the same as an atmosphere during the firing. As a result, similarly to Sample 26, it was confirmed that the volume resistivity of $2 \times 10^7$ $\Omega \cdot cm$ was exhibited, and the volume resistivity appropriate for the member having the static electricity removal function for the semiconductor manufacturing apparatus was exhibited. In addition, the measurement sample may be prepared by forming the electrode by a sputtering method or the like using gold (Au) or the like instead of the screen printing method so as not to be affected by the atmosphere during the heat treatment to fix the electrode.

What is claimed is:

1. An alumina sintered body comprising:
   alumina ($Al_2O_3$) as a main component; and
   titanium (Ti),
   wherein the alumina sintered body further contains at least one element selected from the group consisting of lanthanum (La), neodymium (Nd), and cerium (Ce),
   aluminum (Al) is contained in an amount such that a ratio of aluminum oxide ($Al_2O_3$) to total oxides in the alumina sintered body becomes 93.00 to 99.85% by weight, wherein said total oxides are defined as a total amount of all oxides contained in the alumina sintered body and an amount of each metal in the alumina sintered body being converted into an amount of an oxide containing the metal,
   titanium (Ti) is contained in an amount such that a ratio of titanium oxide ($TiO_2$) to the total oxides becomes 0.10 to 2.00% by weight,
   lanthanum (La), neodymium (Nd), and cerium (Ce) are contained in a combined amount such that a ratio of a combined amount of lanthanum oxide ($La_2O_3$), neodymium oxide ($Nd_2O_3$), and cerium oxide ($CeO_2$) to the total oxides becomes 0.05 to 5.00% by weight, and
   volume resistivity of the alumina sintered body is $1 \times 10^5$ to $1 \times 10^{12}$ $\Omega \cdot cm$ at room temperature.

2. The alumina sintered body according to claim 1, wherein a molar ratio of the combined amount of lanthanum (La), neodymium (Nd), and cerium (Ce) to the amount of titanium (Ti) contained in the alumina sintered body is larger than 0.03 and is less than 5.00.

3. The alumina sintered body according to claim 1, further comprising:
   at least one of silicon (Si) and magnesium (Mg),
   wherein silicon (Si) and magnesium (Mg) are contained in an amount such that a ratio of the amount of silicon oxide ($SiO_2$) to the total oxides and a ratio of the amount of magnesium oxide (MgO) to the total oxides are 1.00% by weight or less, respectively.

4. An alumina sintered body comprising:
   alumina ($Al_2O_3$) as a main component;
   titanium (Ti)
   remainder metal elements, wherein
   the remainder metal elements include: at least one element selected from the group consisting of lanthanum (La), neodymium (Nd), and cerium (Ce); and at least one element selected from the group consisting of magnesium (Mg), calcium (Ca), strontium (Sr), barium (Ba), and silicon (Si),
   aluminum (Al) is contained in an amount such that a ratio of aluminum oxide ($Al_2O_3$) to total oxides in the alumina sintered body becomes 93.00 to 99.85% by weight, wherein said total oxides are defined as a total amount of all oxides contained in the alumina sintered body and an amount of each metal in the alumina sintered body being converted into an amount of an oxide containing the metal,
   titanium (Ti) is contained in an amount such that a ratio of titanium oxide ($TiO_2$) to the total oxides becomes 0.10 to 2.00% by weight,
   lanthanum (La), neodymium (Nd), and cerium (Ce) are contained in a combined amount such that a ratio of a combined amount of lanthanum oxide ($La_2O_3$), neodymium oxide ($Nd_2O_3$), and cerium oxide ($CeO_2$) to the total oxides becomes 0.05 to 5.00% by weight,
   magnesium (Mg), calcium (Ca), strontium (Sr), barium (Ba), and silicon (Si) are contained in amounts such that a ratio of magnesium oxide (MgO) to the total oxides, a ratio of calcium oxide (CaO) to the total oxides, a ratio of strontium oxide (SrO) to the total oxides, a ratio of barium oxide (BaO) to the total oxides, and a ratio of silicon oxide ($SiO_2$) to the total oxides are all 1.00% by weight or less, respectively, and
   volume resistivity of the alumina sintered body is $1 \times 10^5$ to $1 \times 10^{12}$ $\Omega \cdot cm$ at room temperature.

5. An electrostatic chuck comprising the alumina sintered body according to claim 1, wherein the alumina sintered body has a volume resistivity of $1 \times 10^8$ to $1 \times 10^{12}$ $\Omega \cdot cm$ at room temperature.

6. A member having a static electricity removal function for a semiconductor manufacturing apparatus, the member comprising the alumina sintered body according to claim 1, wherein the alumina sintered body has a volume resistivity of $1 \times 10^5$ to $1 \times 10^{10}$ $\Omega \cdot cm$ at room temperature.

7. A semiconductor manufacturing apparatus comprising:
   a plasma chamber,
   wherein the electrostatic chuck according to claim 5 is provided within the plasma chamber.

8. The alumina sintered body according to claim 2, further comprising:
   at least one of silicon (Si) and magnesium (Mg),
   wherein silicon (Si) and magnesium (Mg) are contained in a combined amount such that a ratio of the combined amount of silicon oxide ($SiO_2$) and magnesium oxide (MgO) to the total oxides becomes 1.00% by weight or less, respectively.

9. An electrostatic chuck comprising the alumina sintered body according to claim 2, wherein the alumina sintered body has a volume resistivity of $1 \times 10^8$ to $1 \times 10^{12}$ $\Omega \cdot cm$ at room temperature.

10. An electrostatic chuck comprising the alumina sintered body according to claim 3, wherein the alumina sintered body has a volume resistivity of $1 \times 10^8$ to $1 \times 10^{12}$ $\Omega \cdot cm$ at room temperature.

11. An electrostatic chuck comprising the alumina sintered body according to claim 4, wherein the alumina sintered body has a volume resistivity of $1 \times 10^8$ to $1 \times 10^{12}$ $\Omega \cdot cm$ at room temperature.

12. A member having a static electricity removal function for a semiconductor manufacturing apparatus, the member comprising the alumina sintered body according to claim 2, wherein the alumina sintered body has a volume resistivity of $1 \times 10^5$ to $1 \times 10^{10}$ $\Omega \cdot cm$ at room temperature.

13. A member having a static electricity removal function for a semiconductor manufacturing apparatus, the member comprising the alumina sintered body according to claim 3, wherein the alumina sintered body has a volume resistivity of $1 \times 10^5$ to $1 \times 10^{10}$ Ω·cm at room temperature.

14. A member having a static electricity removal function for a semiconductor manufacturing apparatus, the member comprising the alumina sintered body according to claim 4, wherein the alumina sintered body has a volume resistivity of $1 \times 10^5$ to $1 \times 10^{10}$ Ω·cm at room temperature.

15. A semiconductor manufacturing apparatus comprising:
   a plasma chamber,
   wherein the member having the static electricity removal function according to claim 6 is provided within the plasma chamber.

* * * * *